United States Patent [19]

Chow et al.

[11] Patent Number: 4,702,792
[45] Date of Patent: Oct. 27, 1987

[54] METHOD OF FORMING FINE CONDUCTIVE LINES, PATTERNS AND CONNECTORS

[75] Inventors: Ming-Fea Chow, Poughquagh; William L. Guthrie, Hopewell Junction; Frank B. Kaufman, Amawalk, all of N.Y.

[73] Assignee: International Business Machines Corporation, Armonk, N.Y.

[21] Appl. No.: 791,862

[22] Filed: Oct. 28, 1985

[51] Int. Cl.[4] .......................... C23F 1/00; H05K 3/26; H01L 71/84
[52] U.S. Cl. .................................... 156/628; 156/636; 156/643; 156/645; 156/664; 156/668; 430/313; 430/314
[58] Field of Search ............... 156/628, 636, 643, 645, 156/664–666, 668; 430/313–317, 325

[56] References Cited

U.S. PATENT DOCUMENTS

| | | | |
|---|---|---|---|
| 4,305,779 | 12/1981 | Steeves et al. | 156/636 |
| 4,396,704 | 8/1983 | Taylor | 430/311 |
| 4,435,247 | 3/1984 | Basi et al. | 156/636 |
| 4,450,652 | 5/1984 | Walsh | 51/131.4 |
| 4,507,331 | 3/1985 | Hiraoka | 427/38 |
| 4,551,418 | 11/1985 | Hult et al. | 430/325 |
| 4,552,833 | 11/1985 | Ito et al. | 430/325 |
| 4,599,136 | 7/1986 | Araps et al. | 156/643 |
| 4,599,243 | 7/1986 | Sachdev et al. | 427/38 |

OTHER PUBLICATIONS

Shaw et al., "Photosensitive Glass for Producing Recessed Metallurgy, Eliminating Need for Planarization", IBM TDB vol. 26, No. 3A, p. 1094, Aug. 1983.

Primary Examiner—S. Leon Bashore
Assistant Examiner—Andrew J. Anderson
Attorney, Agent, or Firm—Shirley Church Moore

[57] ABSTRACT

The present invention discloses a method of forming fine conductive lines, patterns, and connectors, and is particularly useful in the formation of electronic devices. The method comprises a series of steps in which: a polymeric material is applied to a substrate; the polymeric material is patterned to form openings through, spaces within, or combinations thereof in the polymeric material; subsequently, conductive material is applied to the patterned polymeric material, so that it at least fills the openings and spaces existing in the polymeric material; and excess conductive material is removed from the exterior major surface of the polymeric material using chemical-mechanical polishing, to expose at least the exterior major surface of the polymeric material. The structure remaining has a planar exterior surface, wherein the conductive material filling the openings and spaces in the patterned polymeric material becomes features such as fine lines, patterns, and connectors which are surrounded by the polymeric material. The polymeric material may be left in place as an insulator or removed, leaving the conductive features on the substrate.

16 Claims, 17 Drawing Figures

METHOD OF FORMING FINE CONDUCTIVE LINES, PATTERNS AND CONNECTORS

BACKGROUND OF THE INVENTION

1. Field of the Invention

This invention relates to a method of forming fine conductive lines, patterns and connectors. The method is particularly useful for the formation of electronic devices.

2. Background Art

The production of micron and submicron dimension electronic devices requires high accuracy in forming fine conductive lines, patterns and connectors. These fine lines and patterns may be part of an individual electronic device structure or may be connecting lines between numerous electronic devices contained within one overall structure or package.

One of the best known and most frequently used techniques for producing fine conductive lines and patterns is the lift-off process. In the lift-off process, a substrate is coated with a polymeric radiation-sensitive layer (resist layer), the upper surface of which is subsequently irradiated to create a pattern of differential solubility or etch resistance within the layer. The desired pattern can be developed either by exposing the irradiated resist layer to a solvent capable of dissolving the irradiated portion (positive-tone resist) or the non-irradiated portion (negative-tone resist). Another technique of developing a resist is to react the irradiated resist with an organometallic reagent which reacts in the irradiated areas of the resist, and then expose the resist layer to an etchant, such as an oxygen plasma, which removes the less etch-resistant, non-irradiated portions of the resist layer. After formation of the patterned resist layer, a conductive layer is applied over the surface of the patterned resist, so that the conductive material fills the openings in the patterned resist layer, contacting the substrate beneath. Subsequently, the conductive material on the upper surface of the patterned resist is removed by treating the polymeric resist thermally or with a solvent, so the polymeric material vaporizes or dissolves away, simultaneously lifting-off overlaying conductive material. The portion of conductive material which filled the openings in the patterned resist layer is left upon the substrate. The lift-off process suffers the disadvantage that frequently portions of the conductive material filling the openings in the patterned resist are removed along with the conductive material overlaying the patterned resist; thus, imperfect lines or patterns remain, sometimes to the extent of creating an open along a conductive line so the electronic device cannot function.

Recently, techniques have been developed for the chemical-mechanical polishing of semiconductor wafers which permit a high degree of accuracy in the uniformity of polished wafer flatness. The description of such a process is presented in detail in U.S. Pat. No. 4,450,652 to R. J. Walsh. In addition, use of chemical-mechanical polishing to enhance removal of non-planar regions of a surface by chemically reacting portions of the surface while mechanically applying force to the chemically reacting portions is described in U.S. Pat. No. 4,435,247 to Basi et al.

It would be advantageous to the microelectronics industry to have a method of producing fine conductive lines by a more reliable and cost effective technique than the current lift-off technology. In addition, it would be desirable to have a simplified process for forming a structure comprising a polymeric insulator in which conductive features, such as fine lines and connectors (horizontal and vertical), are isolated from other conductive features.

SUMMARY OF THE INVENTION

In accordance with the present invention, a method has been developed wherein a a polymeric material is applied to a substrate. The polymeric material is patterned to form openings through, spaces within, or combinations thereof in the polymeric material. Subsequently, conductive material is applied to the patterned polymeric material so that it at least fills the openings and spaces existing within the polymeric material. The excess conductive material overlaying the exterior major surface of the polymeric material is then removed by chemical-mechanical polishing to expose at least the exterior major surface of the polymeric material. The structure remaining has a planar exterior surface, wherein the conductive material filling the openings and spaces in the patterned polymeric material becomes features such as fine lines, patterns, and connectors, which are surrounded by the patterned polymeric material. Depending on the depth to which the polymeric material is patterned initially, the conductive material can extend from the planar surface which has been chemical-mechanical polished to the substrate surface beneath the polymeric material, or from the planar polished surface to a specific depth within the polymeric material.

In cases wherein the polymeric material is an adequate insulator for purposes of the electronic device, it may be useful to leave the polymeric material in place as an insulator. In cases wherein it is desired to replace the polymeric material with a different material, and the depth of conductive material penetration into the patterned polymeric material is through to the substrate underlaying the patterned polymeric material, the polymeric material can be removed using standard solvent or oxygen plasma methods, leaving the conductive features such as fine lines, patterns, and connectors standing alone on the substrate surface.

In accordance with the present invention, it is possible to use more than one layer of polymeric material, wherein the at least one underlaying layer of polymeric material is an insulator and the top layer of polymeric material is a photoresist. The top layer of photoresist is patterned using standard methods such as exposure to actinic radiation followed by development using a solvent. The pattern is then transferred from the top layer of patterned photoresist to the at least one underlaying layer of polymeric material using dry etch techniques such as reactive ion etching or oxygen plasma etching. This method of transfer requires that the etching rate of the photoresist be significantly slower than that of the underlaying polyermic insulator, or that the layer of photoresist be sufficiently thick to permit effective etching of the underlaying polymeric insulator. The conductive material is then applied to the patterned layer of photoresist and the underlaying at least one layer of patterned polymeric insulator, at least filling the openings or spaces within the polymeric layers. The conductive material overlaying the photoresist is then removed by chemical-mechanical polishing to expose at least the upper, exterior major surface of the photoresist. Subsequently, the photoresist may be removed using a solvent or dry etch methods. An additional layer of polymeric insulator can be applied to cover the exposed conductive lines, patterns, or connectors if desired. The photoresist can be chosen so that the removal rate for the photoresist is substantially the same as the removal rate for the conductive material during chemical-mechanical polishing. This permits removal of the conductive material and the photoresist simultaneously to at least the upper surface of the patterned insulator; the remaining structure after polishing having a planar surface, wherein the conductive material fills the openings in the patterned polymeric insulator.

The conductive material typically comprises a metal or metal alloy. Preferred conductive materials include copper, aluminum, copper alloys, aluminum alloys, and in particular aluminum-copper alloy, and aluminum-silicon alloy comprising upto at least 10% silicon. When the conductive material comprises a metal, it may be applied by sputter deposition methods, chemical vapor deposition, or using a carrier material, wherein the carrier material is subsequently left in place or subsequently removed.

The slurry used for chemical-mechanical polishing should produce a significantly higher removal rate for the conductive material than for the polymeric photoresist; this provides the advantage that the photoresist can be used as an etch stop layer. The exception to this requirement is when a polymeric insulator is used as an underlaying layer to the photoresist layer and it is desired to chemical-mechanical polish to remove conductive material and photoresist material simultaneously from the surface of the polymeric insulator layer. In this latter case, the removal rate for the conductive material and the polymeric photoresist should be substantially the same, and the removal rate for the polymeric insulator should be substantially less than that of the conductive material and the photoresist.

It is preferred that the polishing slurry be comprised of components which permit reaction of the slurry with the material to be removed, but not with the underlaying polymeric material to be left in place; the polymeric material to be left in place may be the photoresist or may be the insulator underlaying the photoresist.

It has been discovered that certain resist materials function better in terms of thermal stability during application of the conductive material, and in terms of both thermal and mechanical stability during the chemical-mechanical polishing. A considerable amount of mechanical stress and frictional heat is generated during the chemical-mechanical polishing. In addition, there are optimal temperatures for chemical-mechanical polishing at which the chemical action is enhanced. Useful photoresist materials can withstand a mechanical stress of at least about 60 to about 120 megapascals prior to showing significant deformation. Useful photoresist materials are thermally stable at temperatures at least as high as about 120° C., having a glass transition temperature of at least about 150° C. Preferred photoresist materials are thermally stable at temperature at least as high as about 160° C., and have a glass transition temperature of at least about 150° C. Polymeric photoresist materials meeting the above requirements include, but are not limited to, novolaks which have been hard baked, polyimide photoresists, polyglutarimide photoresists, photoresists comprising silicon, and photoresist materials having functional groups which can be reacted with an organometallic compound such as a silylating (silicon-containing) reagent. Use of a polyfunctional organometallic compound to react with the photoresist provides the advantage of crosslinking as well as the incorporation of a metal into the resist. The result is thermal stability at increased temperatures. In addition, it has been discovered that silylation of a photoresist material results in a decrease in the dielectric constant of the photoresist, making it a better insulator for cases in which it is desired to leave the photoresist in place as an insulator. The preferred range for the dielectric constant when the photoresist is to be left in place as an insulator is from about 2 to about 5 at a frequency of about 100 kilohertz. The reaction of various photoresist materials with organometallic reagents to provide a number of different resist structures is described in U.S. patent applications, Ser. Nos. 609,690 (U.S. Pat. No. 4,552,833), 679,527 (abandoned), 713,370, 713,509, 720,781 (abandoned), and 741,779 (U.S. Pat. No. 4,613,398) (assigned to the assignee of the present invention), which are incorporated herein by reference.

DETAILED DESCRIPTION OF THE INVENTION

The present invention provides a method of producing fine conductive lines, patterns, and connections. Numerous embodiments of the method are possible, including the embodiments described below.

One preferred embodiment of the method of producing fine conductive lines, patterns, and connections comprises the steps of:

(a) applying a layer of photoresist material to the surface of a substrate;

(b) patterning the photoresist material to create openings through the photoresist to the substrate surface;

(c) applying a conductive material to the patterned photoresist so that the openings in the photoresist are at least filled with the conductive material; and (d) removing excess conductive material from the exterior major surface of the photoresist, using chemical-mechanical polishing, leaving conductive material filling the openings in the photoresist.

Figure 1A:
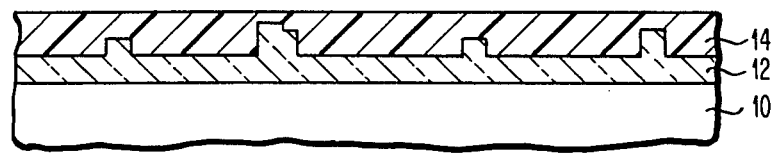
FIGS. 1A through 1E show a series of process steps which illustrate one of the preferred embodiments of the present invention. This embodiment provides a method of forming fine conductive lines, patterns, and/or connections on a substrate.
Figure 1B:
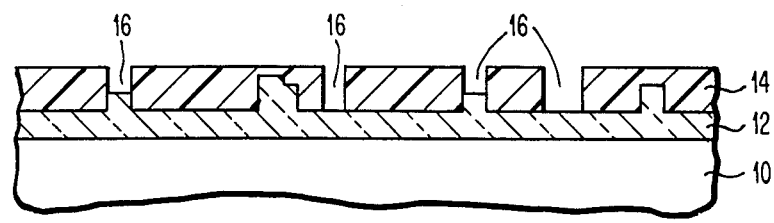
Figure 1C:
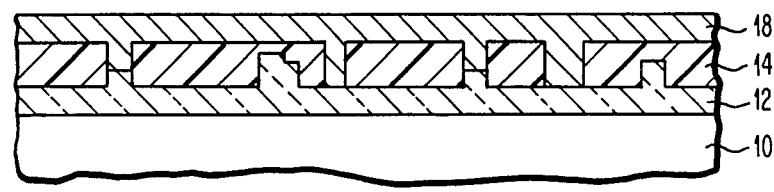
Figure 1D:
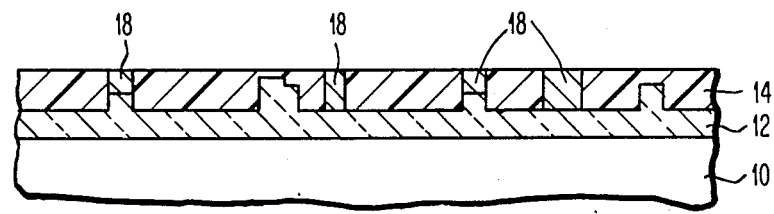

The above embodiment is illustrated in FIGS. 1A through 1D. FIG. 1A shows the photoresist layer 14 applied over a substrate surface 12 on a silicon wafer 10. FIG. 1B shows the photoresist layer 14 after patterning to create openings 16. FIG. 1C shows the resultant structure after application of the conductive material 18 to the surface of the photoresist layer 14, filling the openings 16 within the photoresist layer 14. FIG. 1D shows the resultant structure after chemical-mechanical polishing to remove excess conductive material 18 from the exterior major surface of the photoresist 14.

Figure 1E:
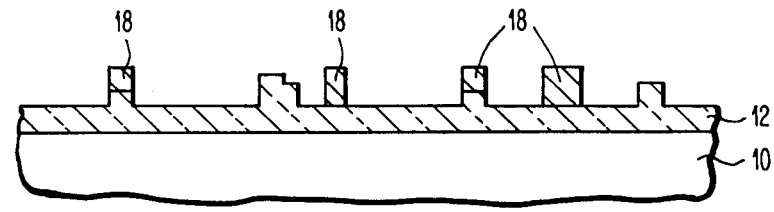

A second preferred embodiment would comprise all of the steps (a) through (d) above, wherein at least some of the openings through the polymeric material extend to the underlaying substrate, and include an additional step (c) in which the patterned photoresist is removed using a solvent or oxygen plasma etch, leaving at least portions of said conductive material 18 contacting the surface of the substrate. FIG. 1E shows this additional step, wherein the conductive material 18 remains on the surface of the substrate 12.

A third embodiment of the method of producing fine conductive lines, patterns and connections comprises the steps of:

(a) applying a layer of photoresist material to the surface of a substrate;

(b) patterning the photoresist material using etching techniques to create a pattern of open spaces within the photoresist;

(c) applying a layer of conductive material to the surface of the photoresist so that the spaces etched within the photoresist are at least filled with the conductive material; and (d) removing the conductive material from the exterior major surface of the photoresist, using chemical-mechanical polishing, leaving conductive material filling the spaces etched within the photoresist.

A fourth and preferred embodiment of the method of producing fine conductive lines, patterns, and connections comprises the steps of:

(a) applying a photoresist material to the surface of a substrate;

(b) patterning the photoresist to form openings through, spaces within, or combinations thereof in the photoresist;

(c) treating the photoresist with an organometallic compound, so that the organometallic compound is incorporated into at least the portions of the photoresist near the contact surface between the photoresist and the organometallic compound;

(d) applying a conductive material to the treated surface of the photoresist so that the openings and spaces existing in the treated photoresist are at least filled with the conductive material; and (e) removing at least excess conductive material from the exterior major surface of the photoresist, using chemical-mechanical polishing means.

Figure 2A:
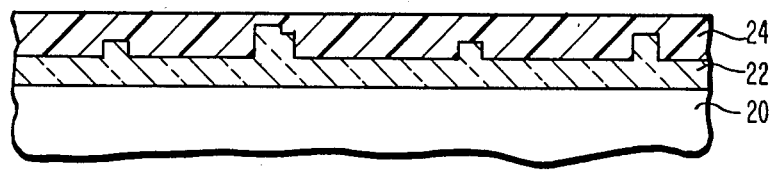
FIGS. 2A through 2E show a series of process steps which illustrate another of the preferred embodiments of the present invention. This embodiment provides a method of forming fine conductive lines, patterns, and/or connections which are isolated from other conductive lines, patterns, and/or connections by the photoresist which has been left in place to function as an insulator.
Figure 2B:
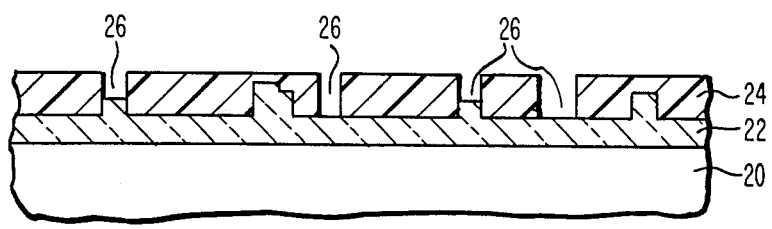
Figure 2C:
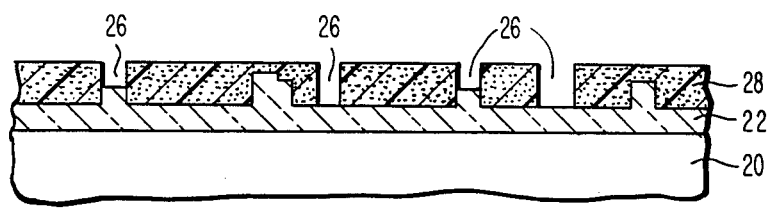
Figure 2D:
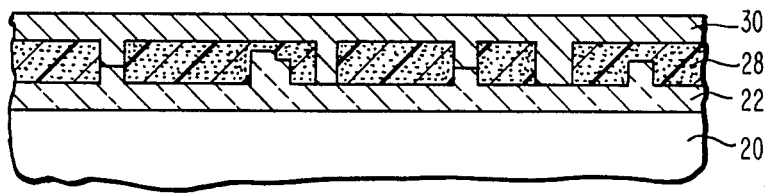
Figure 2E:
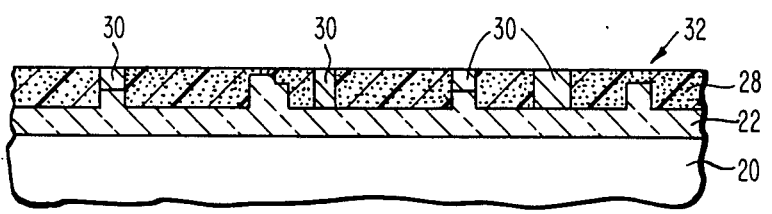

The fourth preferred embodiment is illustrated in FIGS. 2A through 2E. FIG. 2A shows a layer of photoresist material 24 applied over a substrate surface 22 on a silicon wafer 20. FIG. 2B shows the layer of photoresist material 24 after patterning to create openings 26. FIG. 2C shows the reacted layer of photoresist material 28 after treatment with an organometallic compound to incorporate the organometallic compound into the photoresist. FIG. 2D shows the resultant structure after application of the conductive material 30 to the surface of the treated photoresist layer 28. FIG. 2E shows the resultant structure after chemical-mechanical polishing to remove the conductive material from the exterior major surface of the photoresist 32.

A fifth preferred embodiment would comprise all of the steps (a) through (e) of the fourth preferred embodiment, and include an additional step (f) in which the patterned photoresist is removed, leaving the conductive material with at least portions thereof in contact with the substrate.

A sixth embodiment of the method of producing fine conductive lines, patterns, and connections comprises the steps of:

(a) applying a photoresist material to the surface of a substrate;

(b) exposing the photoresist material to patterned radiation to create a latent image within the photoresist, which latent image is capable of reacting with an organometallic compound or of controlling the permeation of an organometallic compound;

(c) treating the imaged photoresist with an organometallic compound;

(d) removing the portions of the photoresist which are non-exposed and non-reacted or non-permeated, and which are not protected by portions which have been exposed and reacted or permeated by organometallic compound, using dry etching techniques such as oxygen plasma, to provide openings through, spaces within, or combinations thereof in the photoresist;

(e) applying a conductive material to the etched photoresist, so that the etched openings and spaces existing in the photoresist are at least filled with conductive material; and (f) removing at least excess conductive material from the exterior major surface of the photoresist, using chemical-mechanical polishing, leaving conductive material filling the spaces etched within the photoresist.

The process described in the sixth preferred embodiment can be carried out so that the etched spaces in the photoresist extend from the surface of the photoresist through to the substrate underlaying the photoresist, or so that the etched spaces in the photoresist extend only partially through the thickness of the photoresist. A seventh embodiment of the method of the present invention, comprises steps (a) through (f) of the sixth embodiment, and wherein at least some of the openings through the photoresist extend to the substrate underlaying the photoresist, includes an additional step: (g) removing the photoresist, leaving the conductive material with at least portions thereof in contact with the substrate.

A eighth and preferred embodiment of the method of producing fine conductive lines, patterns, and connections comprises the steps of:

(a) applying a polymeric insulator to the surface of a substrate;

(b) applying a photoresist material to the exterior surface of the polymeric insulator;

(c) patterning the photoresist material to form openings through the photoresist to the polymeric insulator surface;

(d) treating the patterned photoresist with an organometallic compound to create an etch-resistant form of the photoresist;

(e) transferring the pattern from the photoresist to the polymeric insulator;

(f) applying a conductive material to the surface of the photoresist, so that the openings in the photoresist and underlying polymeric insulator are at least filled with the conductive material;

(g) removing excess conductive material from the exterior major surface of the photoresist, using chemical-mechanical polishing, leaving conductive material filling the openings in the photoresist;

(h) removing the patterned photoresist, leaving the conductive material extending above the surface of the polymeric insulator.

Figure 3A:
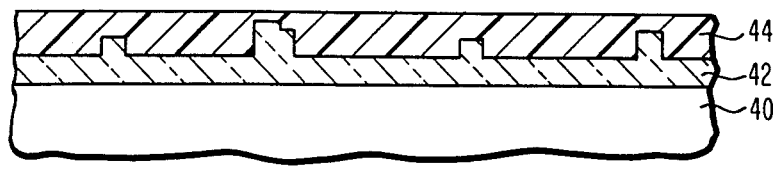
FIGS. 3A through 3G show a series of process steps which illustrate another of the preferred embodiments of the present invention. This embodiment provides a method of forming fine conductive lines, patterns and/or connections which are isolated from other conductive lines, patterns, and/or connections by an underlaying insulator layer and an overlaying photoresist layer, which is also capable of serving as an insulator layer. The photoresist layer can be removed if desired, leaving the fine conductive lines, patterns, and/or connections extending above a planar layer of insulator which isolates the various conductive lines, patterns and/or connections.
Figure 3B:
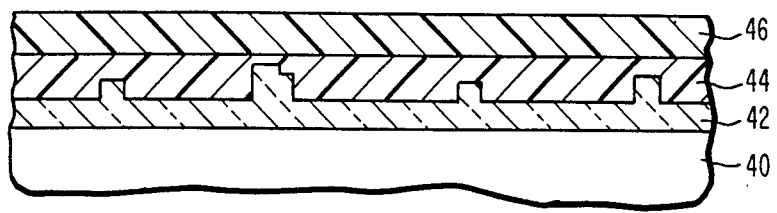
Figure 3C:
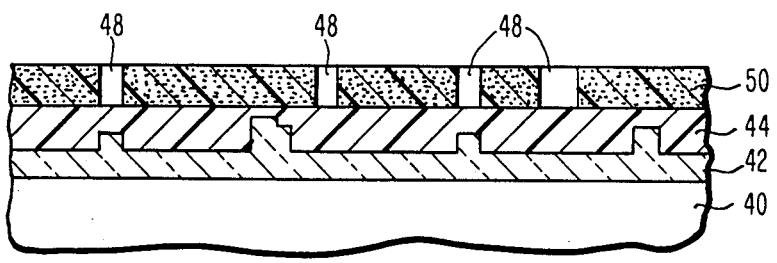
Figure 3D:
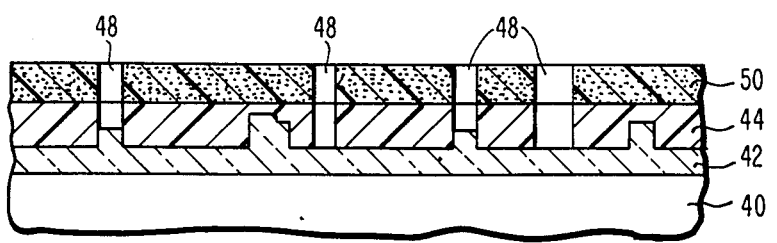
Figure 3E:
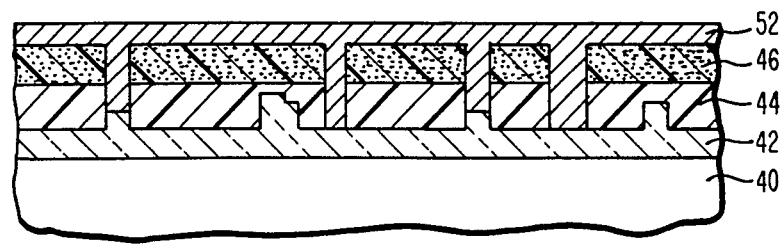
Figure 3F:
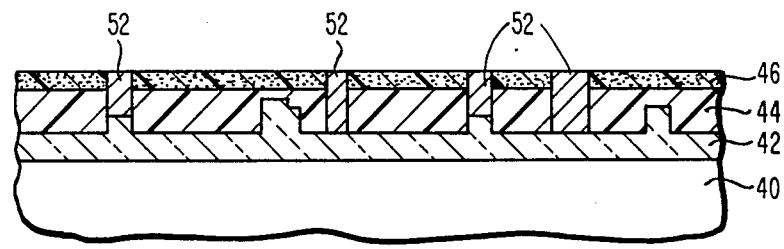
Figure 3G:
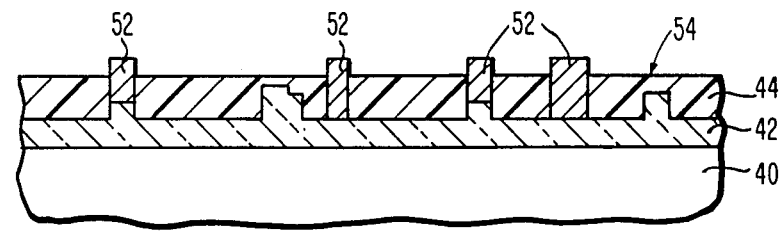

The eight preferred embodiment is illustrated in FIGS. 3A through 3G. FIG. 3A shows a layer of polymeric insulator 44 deposited on a substrate 42 supported by a silicon wafer 40. FIG. 3B shows a layer of photoresist 46 applied over the layer of polymeric insulator 44. FIG. 3C shows the patterned, reacted photoresist 50 after patterning of photoresist 46 to create openings 48, and reaction of the patterned photoresist with an organometallic compound or permeation of the patterned photoresist by an organometallic compound to create etch-resistant, patterned photoresist 50. Photoresist 50 overlays polymeric insulator 44. FIG. 3D shows the multilayer patterned resist structure after the pattern of openings 48 has been transferred, using a reactive ion etch, from the patterned, reacted photoresist 50 to the insulator layer 40. FIG. 3E shows conductive material 52 applied to the surface of the multilayer patterned resist, filling the openings 48 through patterned photoresist 50 and patterned insulator layer 44. FIG. 3F shows the structure after chemical-mechanical polishing to remove at least the excess conductive material from the surface of the patterned photoresist 50. FIG. 3G shows the removal of patterned, reacted photoresist layer 50 to expose the conductive metal lines and patterns 52 above the insulator surface 54.

A ninth embodiment would comprise all of the steps (a) through (h) of the eighth preferred embodiment, and include an additional step (i), wherein an additional insulator is applied, at least covering the conductive material extending above the surface of the first layer of polymeric insulator. The additional insulator may be an inorganic insulator or a polymeric insulator.

A tenth embodiment would comprise steps (a) through (f) of the eighth preferred embodiment, and include an additional step (g) removing both the conductive material and the photoresist from the exterior major surface of the polymeric insulator using chemical-mechanical polishing, wherein the relative removal rates of the conductive material and treated photoresist material are substantially the same.

The conductive material typically used in the practice of the present invention is a metal or metal alloy, such as Al, Cu, Al-Cu, Al-Si.

The photoresists used in the method of the present invention include hard-baked novolaks, polyimide photoresists, polyglutarimide photoresists, photoresists comprising silicon, and photoresist materials having functional groups which can be reacted with an organometallic reagent.

When a hard-baked novolak is used, the novolak photoresist is typically exposed to source of radiation to which it is sensitive, in order to create a latent image. The latent image is subsequently developed using standard aqueous base developer. After development, the patterned novolak resist is baked at a temperature of at least about 210° C. to provide the hard-baked patterned novolak resist. Commerically available novolak photoresists of the type which can be used in the practice of the present invention include AZ 1350J and Kodak 820.

Commercially available polyimide photoresists of the type which can be used in the practice of the present invention include Ciba-Geigy Probimide 300 and Toray Photoneece.

Examples of polyglutarimide photoresists which can be used in the practide of the present invention include poly(dimethylglutarimide) and polyglutarimides comprising poly(dimethylglutarimide) units.

Examples of photoresists comprising silicon include polydiazasiloxane, poly(silane sulfone), and compolymers of acrylic acid, methacrylic acid or their esters with a silicon-containing oxime ester of methacrylic acid.

Examples of photoresist materials having functional groups which can be reacted with an organometallic reagent include, but are not limited to: prepolymerized phenol-formaldehyde polymers which can contain diazo ketone sensitizer (as known in the art); photoresist polymers having functional groups such as OH, COOH, NH, and SH; photoresist polymers having functional epoxide groups which are capable of undergoing ring opening and forming OH groups. Examples of other photoresist polymers having the necessary functional groups include polyvinylpyrrolidone, polyvinylalcohol, polymers of p-hydroxystyrene, melamino polymers, homopolymers and copolymers of monoethylenically unsaturated acids, copolymers of alkyl methacrylates containing about 1–4 carbon atoms in the alkyl group, and a monoethylenically unsaturated acid. Examples of photoresist materials capable of generating functional groups upon irradiation, which functional groups can be reacted with an organometallic reagent include o-nitrobenzene derivatives and polymers capable of photo-fries rearrangement. Upon irradiation, acids, alcohols, and/or amines with reactive hydrogens are generated within these materials. Photoresist materials comprising the functional groups capable of reacting with an organometallic reagent can be used alone or in combination with compatible polymeric materials.

The organometallic compounds which can be used in the practice of the present invention include compounds wherein suitable metallic portions of the organometallic material comprise Group III A metals, Group IV A metals, Group IV B metals, and Group VI B metals. An example of a Group III A metal is aluminum. Examples of Group IV A metals are tin, germanium, and silicon. Examples of Group IV B metals are titanium and zirconium. Examples of Group VI B metals are tungsten and molybdenum. The preferred metallic portions are titanium;, silicon, and tin, with the most preferred being silicon. The most preferred organometallic compounds are the multifunctional organometallic compounds which are capable of crosslinking the photoresist while simultaneously incorporating the metal atoms. The overall effect of using the multifunctional organometallic compounds is increased thermal stability of the reacted photoresist, improved mechanical stability of the reacted photoresist, and a lower dielectric constant of the reacted photoresist (making it a better insulator). Examples of preferred multifunctional organometallic compounds are specified at length in U.S. patent application, Ser. No. 713,509, which has previously been incorporated by reference.

The chemical-mechanical polishing techniques to be used for removal of the conductive material overlaying the photoresist are known in the art and have been referred to in the specification. An important consideration applicable to the practice of the present invention is the slurry to be used for polishing. It is preferred that the slurry used for polishing have a significantly higher removal rate for the conductive material than for the photoresist; this provides the advantage that the photoresist may be used as an etch stop layer. In addition, it is preferred that the polishing slurry permit reaction with the conductive material on the polishing surface, but not with the photoresist. In the case wherein the conductive material is an aluminum based alloy such as AlCu, the slurry may be comprised of an alumina powder in a dilute acid (typically $HNO_3$ solution) to produce a pH less than about 3. Additional polishing techniques are described in U.S. patent application Ser. No. 791,860 to K. D. Beyer et al. filed concurrently herewith and entitled Chem-Mech Polishing Method For Producing Coplanar Metal/Insulator Films On A Substrate, the disclosure of which is incorporated herein by reference.

EXAMPLE 1

As shown in FIG. 1A, a layer of novolak photoresist 14 was applied over a silicon oxide comprised surface 12 on a silicon wafer 10, using standard spin coating techniques. The novolak coating was then baked at about 80° C. for a period of about 30 minutes, to produce a dry coating about 1.5 micrometer thick. The photoresist 14 was exposed to actinic radiation to create a latent image, which was subsequently developed using aqueous base to create a pattern of openings 16, as shown in FIG. 1B. The patterned novolak was converted to the "hard-baked" condition by baking in an oven, beginning at about 80° C. and increasing the oven temperature, at a rate ranging from about 1° C. per minute to about 5° C. per minute, to a maximum temperature of about 250° C. A layer of Al-Cu alloy 18 was then applied to the patterned novolak photoresist 14 using electron-beam deposition, filling the openings and leaving a coating of about 2 micrometers in thickness of the surface of the photoresist 14, as shown in FIG. 1C. Chemical-mechanical polishing using an $Al_2O_3/HNO_3$ slurry was then used to remove excess Al-Cu 18 from the exterior surface of photoresist 14, as shown in FIG. 1D. Subsequently, the photoresist 14 was removed, using an oxygen plasma, to create the structure shown in FIG. 1E, wherein the Al-Cu 18 in the form of thin lines about 1.5 micrometer in width and about 1.5 micrometer in height remains upon the surface comprised of silicon oxide 12.

EXAMPLE 2

As shown in FIG. 2A, a layer of novolak photoresist 24 was applied to a silicon oxide surface 22 on a silicon wafer 20, using standard spin coating techniques. The novolak coating was then baked at about 80° C. for a period of about 15 minutes to produce a dry film thickness of about 1.5 micrometers. The novolak photoresist 24 was then patterned by exposure to actinic radiation and developed using aqueous base to create openings 26 in the photoresist 24, as shown in FIG. 2B. The novolak photoresist 24, was treated at room temperature with polyfunctional silylating agent in a carrier solvent, about 10% by weight hexamethylcyclotrisilazane in xylene carrier solvent, in order to crosslink and incorporate silicon into the novolak photoresist 24, converting it in form to silylated photoresist 28, as shown in FIG. 2C. Subsequently, Al-Cu alloy 30 was applied to silylated photoresist 28 using standard metal sputtering technique, filling the openings and leaving a coating of about 2.5 micrometer on the surface of silylated photoresist 28, as shown in FIG. 2D. Chemical-mechanical polishing with $Al_2O_3/HNO_3$ slurry is then used to remove excess Al-Cu 30 from the major exterior surface 32 of silylated photoresist 28, as shown in FIG. 2E, and described in EXAMPLE 1.

EXAMPLE 3

As shown in FIG. 3A, an approximately 5 micrometer thick layer of a PMDA-ODA polyimide 44 was applied to a silicon oxide comprised surface 42 on a silicon wafer 40, as shown in FIG. 3A, using standard spin coating techniques. The polyimide was subsequently baked at about 230° C. for a period of about 30 minutes, followed by 350° C. for a period of about 30 minutes. A layer of a novolak photoresist 46 was applied to the surface of the polyimide 44, using standard spin coating techniques, and baked for a period of about 30 minutes at a temperature of about 80° C. to produce a dry film thickness of about 1.1 micrometer, as shown in FIG. 3B. The novolak photoresist 46 was then patterned by exposure to actinic radiation and developement using aqueous base, to create openings 48 in the novolak photoresist 46. Subsequently, the novolak photoresist 46 was treated with multifunctional silylating agent hexamethylcyclotrisilane, as described in EXAMPLE 2, to create patterned silylated photoresist 50, as shown in FIG. 3C. Subsequently the pattern was transferred from silylated photoresist 50 to polyimide layer 44 using oxygen reactive ion etching to produce the structure shown in FIG. 3D. Al-Cu alloy 52 was then applied to the silylated photoresist 50 using standard metal sputtering technique, filling the openings 48 and leaving a coating of Al-Cu 52 about 8 micrometers thick on the surface of silylated photoresist 50, as shown in FIG. 3E. Chemical-mechanical polishing with $Al_2O_3/HNO_3$ slurry is then used to remove the excess Al-Cu 52 from the surface of silylated photoresist 50, as shown in FIG. 3F. The structure can be left in this form, when a planar surface is desired, as the silylated novolak photoresist 50 is a good insulator in itself, having a dielectric constant of 3.5 as compared with the polyimide 42 dielectric constant of 3.8. However, the silylated photoresist 50 can also be subsequently removed using a $CF_4$—$O_2$ plasma, to produce the structure shown in FIG. 3G, wherein the Al-Cu 52 extends above the major exterior surface 54 of the polyimide layer.

The detailed description of the present invention, including preferred embodiments, provides a number of variations within the present invention. Many modifications and ramifications will occur to those skilled in the art upon a reading of the present disclosure; these modified embodiments are intended to be included herein.

What is claimed is:

1. A method of forming fine conductive lines, patterns, and connections, comprising the steps of:
    (a) applying a polymeric material to a substrate;
    (b) patterning said polymeric material to form openings through, spaces within, or combinations thereof within said polymeric material;
    (c) applying conductive material to said polymeric material, thereby at least filling said openings and spaces existing within said polymeric material; and
    (d) removing at least excess conductive material from the major exterior surface of said polymeric material using chemical-mechanical polishing means.

2. The method of claim 1, wherein at least some of said openings through said polymeric material extend to said substrate underlaying said polymeric material, and including an additional step: (e) removing said polymeric material, leaving at least portions of said conductive material contacting said substrate.

3. The method of claim 1, wherein said polymeric material is a photoresist.

4. The method of forming fine lines, patterns, and connections, comprising the steps of:
   (a) applying a polymeric photoresist to the surface of a substrate;
   (b) patterning said photoresist to form openings through, spaces within, or combinations thereof in said photoresist;
   (c) treating said photoresist with an organometallic compound, so that said organometallic compound is incorporated into at least the portions of said photoresist near the contact surface between said photoresist and said organometallic compound;
   (d) applying a conductive material to said treated photoresist, so the openings in said treated photoresist are at least filled with said conductive material; and
   (e) removing at least excess conductive material from the exterior major surface of said photoresist, using chemical-mechanical polishing means.

5. The method of claim 4, wherein at least some of said openings through said photoresist extend to said substrate underlaying said photoresist, and including an additional step: (f) removing said photoresist, leaving said conductive material with at least portions thereof in contact with said substrate.

6. A method of forming fine conductive lines, patterns, and connections, comprising the steps of:
   (a) applying a photoresist material to the surface of a substrate;
   (b) exposing said photoresist to patterned radiation to create a latent image within said photoresist, said latent image being capable of reacting with an organometallic compound or of controlling the permeation of an organometallic compound;
   (c) treating the imaged photoresist with said organometallic compound;
   (d) removing the portions of said photoresist which are non-exposed and non-reacted or which are non-permeated, and which are not protected by portions of said photoresist which have been exposed and reacted or permeated by said organometallic compound, using dry etching techniques which employ an oxygen-containing plasma to provide openings through, spaces within, or combinations thereof in said photoresist;
   (e) applying conductive material to the etched photoresist, so that the openings and spaces existing in said photoresist are at least filled with conductive material; and
   (f) removing at least excess conductive material from the exterior major surface of said photoresist, using chemical-mechanical polishing, leaving conductive material filling said openings and spaces etched in said photoresist.

7. The method of claim 6, wherein at least some of said openings through said photoresist extend to said substrate underlaying said photoresist, and including an additional step: (g) removing said photoresist, leaving said conductive material with at least portions thereof in contact with the substrate.

8. A method of forming fine conductive lines, patterns, and connections, comprising the steps of:
   (a) applying a polymeric insulator to the surface of a substrate;
   (b) applying a photoresist to the exterior surface of said polymeric insulator;
   (c) patterning said photoresist to form openings through said photoresist to the surface of said polymeric insulator;
   (d) treating said patterned photoresist with an organometallic compound to create an etch-resistant form of said photoresist;
   (e) transferring the pattern from said treated photoresist to said polymeric insulator using an oxygen plasma;
   (f) applying a conductive material to the surface of said photoresist, so that said openings in said photoresist and underlaying polymeric insulator are at least filled with said conductive material; and
   (g) removing at least excess conductive material from the exterior major surface of said photoresist, using chemical-mechanical polishing, leaving conductive material filling said openings in said photoresist.

9. The method of claim 8 including the additional step: (h) removing said patterned photoresist, leaving said conductive material extending above the surface of said polymeric insulator.

10. The method of claim 9, including an additional step: (i) applying a second insulator to the surface comprising said conductive material extending above said polymeric insulator, so that said second insulator at least covers said conductive material extending above said surface of said polymeric insulator.

11. The method of claim 10 wherein said second insulator is an inorganic insulator.

12. The method of claim 11, wherein said second insulator is a polymeric insulator.

13. A method of forming fine lines, patterns, and connectors, comprising the steps of:
   (a) applying a polymeric insulator to the surface of a substrate;
   (b) applying a photoresist material to the exterior surface of said polymeric insulator;
   (c) patterning said photoresist to form openings through said photoresist to said polymeric insulator surface;
   (d) treating the patterned photoresist with an organometallic compound to create an etch-resistant form of said photoresist;
   (e) transferring the pattern from the photoresist to the polymeric insulator using reactive ion etching;
   (f) applying a conductive material to the surface of said photoresist, so that said openings in said photoresist and said underlaying polymeric insulator are at least filled with conductive material;
   (g) removing both said conductive material and said photoresist from the exterior major surface of said polymeric insulator simultaneously, using chemical-mechanical polishing, wherein the relative removal rates of said conductive material and said treated photoresist material are substantially the same.

14. The method of claim 6, 7, 8, 9, 10, 11, 12 or 13, wherein said organometallic material comprises a polyfunctional organometallic material.

15. The method of claim 6, 7, 8, 9, 11, 12, or 13, wherein said photoresist is capable of reacting with said organometallic material.

16. The method of claim 15 wherein said organometallic material comprises a polyfunctional organometallic material.

* * * * *

UNITED STATES PATENT AND TRADEMARK OFFICE
CERTIFICATE OF CORRECTION

PATENT NO. : 4,702,792

DATED : October 27, 1987

INVENTOR(S) : Ming-Fea Chow, William L. Guthrie & Frank B. Kaufman

It is certified that error appears in the above-identified patent and that said Letters Patent is hereby corrected as shown below:

Column 5, line 16, change "Step (c)" to --Step (e)--.

Signed and Sealed this

Twelfth Day of July, 1988

Attest:

DONALD J. QUIGG

Attesting Officer

Commissioner of Patents and Trademarks